Figure 1:
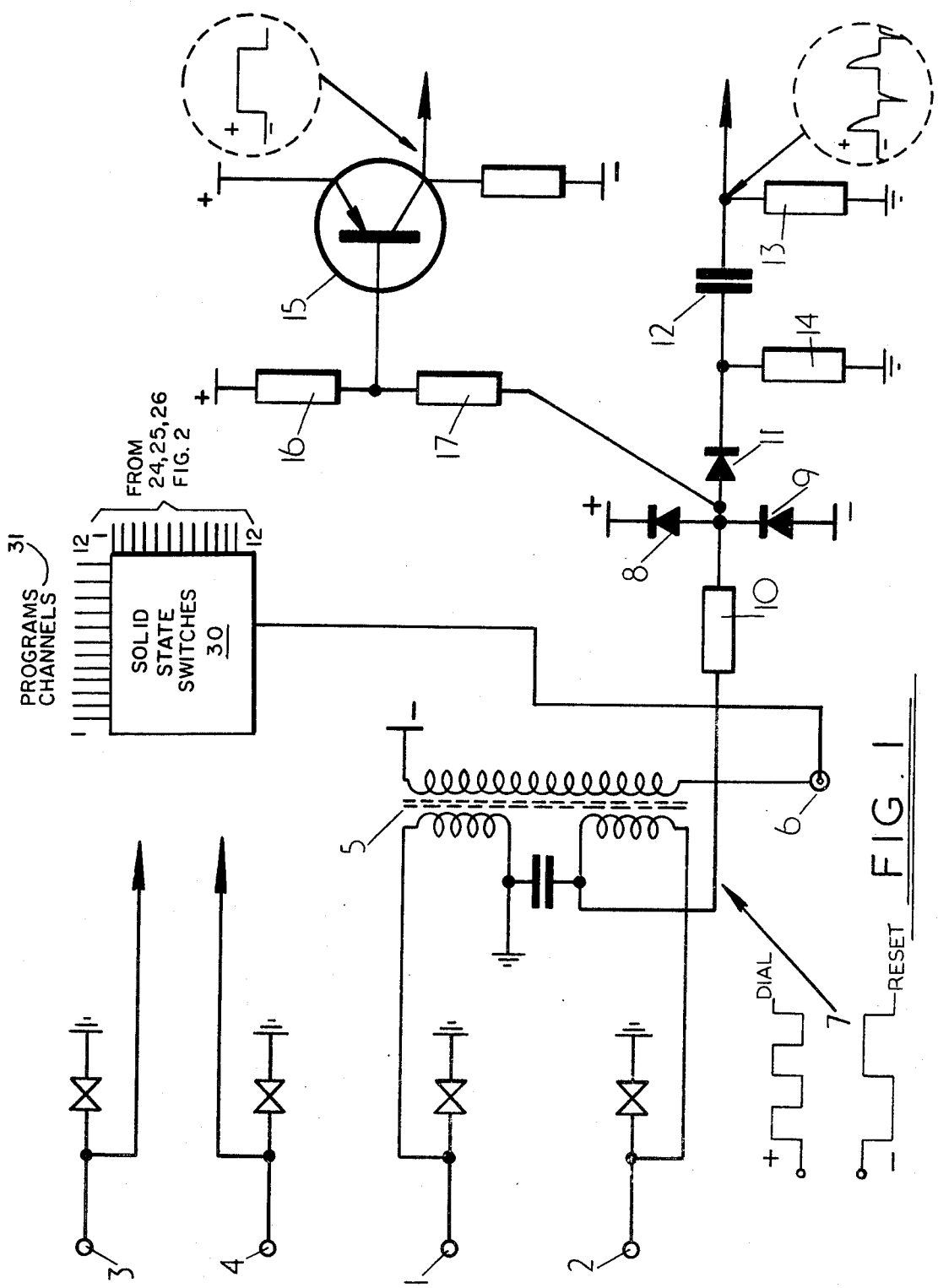

United States Patent [19]

Gargini

[11] 4,153,847
[45] May 8, 1979

[54] LOGIC CIRCUITS

[75] Inventor: Eric J. Gargini, West Drayton, England

[73] Assignee: Communications Patents Limited, London, England

[21] Appl. No.: 846,592

[22] Filed: Oct. 28, 1977

[30] Foreign Application Priority Data

Nov. 10, 1976 [GB] United Kingdom ............... 46864/76

[51] Int. Cl.² ...................... H03K 17/56; H03K 17/62
[52] U.S. Cl. ................................ 307/243; 307/223 R; 307/236; 307/269; 328/104; 328/154; 325/308; 358/86
[58] Field of Search ............... 307/203, 221 R, 223 R, 307/269, 242, 243, 241, 236; 328/37, 104, 152, 154; 325/308; 358/86

[56] References Cited

U.S. PATENT DOCUMENTS 3,757,225  9/1973  Ulicki ................................. 358/86 X Primary Examiner—John Zazworsky
Attorney, Agent, or Firm—Laurence R. Brown

[57] ABSTRACT

A logic circuit is described for controlling a plurality of solid state switches in a wired broadcasting system. The circuit is arranged to distinguish between dialling and reset pulse signals applied to an input, and has a plurality of outputs to which the solid state switches are connected. The circuit sequentially switches the condition of the outputs in response to dial pulse signals, and resets the outputs to a datum condition in response to the reset pulse signal.

6 Claims, 2 Drawing Figures

LOGIC CIRCUITS

The present invention relates to logic circuits for use in for example wired broadcasting systems in which a number of television and other programmes may be transmitted through a distribution network to a plurality of subscribers, the subscribers being able to select desired programmes by controlling a switch.

Various systems have been proposed to make a number of television transmissions available to subscribers, and a system which offers a number of advantages over alternative systems is described in our British Patent Specification No. 1,272,594. This system is based on the use of programme exchanges each serving a group of subscribers each of whom has his own individual vision circuit to the programme exchange. The vision circuit is provided by a twisted pair of conductors with interstitial conductors associated with each pair which are suitable for audio frequency circuits and/or for the transmission of signals for controlling switch means at the programme exchange. The switch means enable the selection of any one of a number of programmes by the subscriber for application to the twisted pair vision circuit for transmission to that subscriber. In general a number of such programme exchanges distributed over the network area each receives a number of colour transmissions through a trunk network from a central programme station, commonly referred to as the transmitter.

Such a system is extremely versatile and may be used not only for the transmission of vision signals from the programme exchanges to the individual subscribers, but a wide range of other facilities can be provided.

In many cases the subscriber will also be a telephone subscriber, and our British Patent Specification No. 1,414,127, describes how a telephone service to the subscriber may be provided by utilising the intersticial conductors of the wired broadcasting system. Specifically, Specification No. 1,414,127, describes and claims a wired broadcasting system in which each of a plurality of subscribers is connected to a programme exchange through the intermediary of a twisted pair of high frequency television signal conductors having associated therewith a pair of audio frequency conductors, each of the pair of audio frequency conductors being located in a corresponding one of a pair of interstices formed between the pair of high frequency television signal conductors, and in which means are provided whereby a telephone instrument at a subscribers premises may be connected to a telephone exchange through a signal path including that subscribers audio frequency signal conductors.

In the embodiments described in Specification No. 1,414,127, an electro-mechanical television programme selector switch is provided in respect of each subscriber at the programme exchange. The cost of such electro mechanical switches has increased whilst the cost of solid state devices has decreased.

It is an object of the present invention to enable the replacement of electro-mechanical switches by solid state devices in wired broadcasting systems, for example systems such as are described in Specification No. 1,414,127.

According to the present invention, there is provided a logic circuit for controlling a plurality of solid-state switches, comprising an input to which in use distinguishable dialling and reset pulse signals are applied, a plurality of outputs to which in use the respective solid state switches are connected, means for distinguishing between the dial and reset pulse signals, means for sequentially switching the condition of the outputs in response to dial pulse signals, and means for resetting the outputs to a datum condition in response to the reset pulse signal.

Preferably the outputs of the logic circuit are provided by a shift register clocked by the dial pulse signals. Advantageously, the reset pulse is applied to both the "reset" and "data in" input of the register, and the circuit is arranged to derive a clock pulse from the reset pulse, whereby receipt of the reset pulse first clears the register and secondly introduces a data pulse into the first position of the register.

Figure 2:
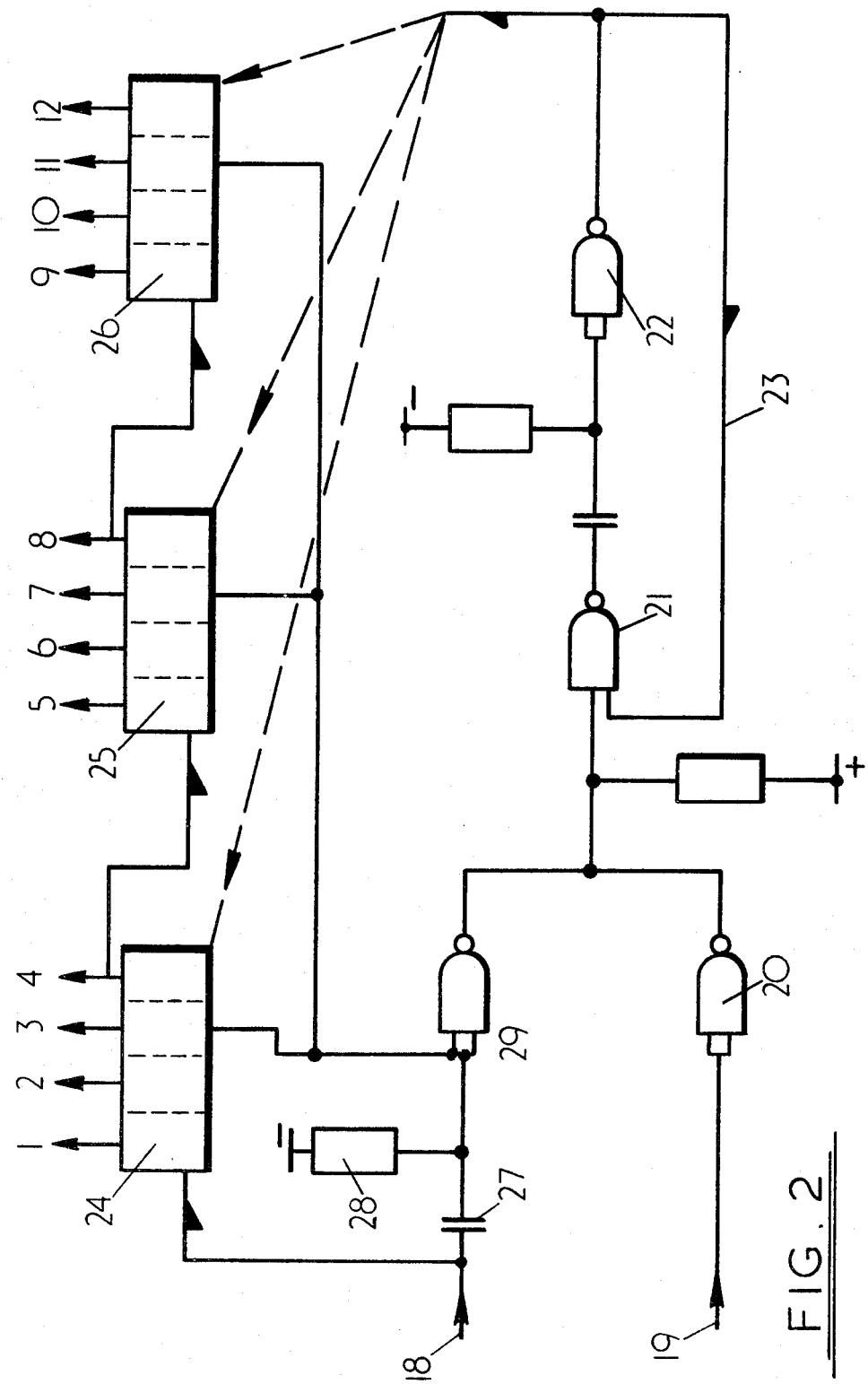

An embodiment of the present invention will now be described, by way of example, with reference to the accompanying drawings, in which:

FIG. 1 shows a circuit for distinguishing between D.C. dial and reset pulses; and FIG. 2 shows a logic circuit for utilising the output of the circuit of FIG. 1.

Referring to FIG. 1, the terminals of a two-pair "Quist" cable such as is described in more detail in our British Patent Specification No. 1,272,594, are shown. One conductor pair of 26 s.w.g. is connected to terminals 1, 2 and carries any one selected HF television signal in the band 4 to 10MHz. The other conductor pair of 27 s.w.g. is connected to terminals 3, 4 and carries telephone signals and a plurality of F.M. radio signals on frequency-distinguished carriers in the band 14 to 22 MHz. The terminals 1 to 4 are located at a central exchange and connected by the two-pair cable to a respective subscriber. Further details of the general arrangement may be obtained by reference to our British Patent Specification No. 1,414,127.

The conductor connected to terminal 2 conveys positive dial pulses and a negative reset pulse to the exchange from the subscriber, the conductor connected to terminal 1 forming a signalling earth return. The terminals 1 and 2 are connected to a split primary winding of a transformer 5, the two sections of the primary being in phase opposition so that the DC signalling currents do not saturate the transformer core. An externally provided HF television signal is applied to the secondary of the transformer 5 via terminal 6 from a solid state switch array 30.

The dial and reset pulses appear on line 7 and are applied to the common terminal of two high current rating diodes 8, 9. A positive over-voltage appearing on line 7 causes diode 8 to conduct, whereas a negative over-voltage causes diode 9 to conduct. A resistor 10 acts as a current limiter. Thus the logic circuit to which the dial and reset pulses are applied and which is described hereinafter is protected against over voltages due to for example lightening striking the cable system.

The dial pulses which are positive-going are passed by a diode 11 to a differentiating network formed by a capacitor 12 and a resistor 13 which is connected to the negative supply rail. A resistor 14 provides a DC return path to earth for the diode 11.

The reset pulses which are negative-going are stopped by the diode 11 and applied with the dial pulses to the base of a transistor 15. The transistor 15 is biased by a potential divider formed by resistors 16 and 17 so as to be normally non-conductive. The reset pulses which are negative-going cause the transistor 15 to conduct so as to produce a positive-going pulse at its collector.

Referring now to FIG. 2, the separated reset and dial pulses are applied to the inputs 18 and 19 respectively of a logic circuit. The dial pulses are squared up by a first NAND gate 20 and by second and third NAND gates 21 and 22 around which a positive feedback path 23 is provided. The shaped pulses are then applied as clock pulses to a shift register formed by three four bit registers 24, 25 and 26. The fourth outputs of registers 24 and 25 provide data inputs to the registers 25 and 26 respectively.

The reset pulse is differentiated by the circuit formed by capacitor 27 and resistor 28 and then applied to the clear inputs of the three registers 24, 25 and 26. The differentiated reset pulse is also squared up by a NAND gate 29 and applied to the clock pulse forming arrangement. In addition, the reset pulse on input 18 is applied directly to the data input of the first register 24.

The duration of the reset pulse is such that the following sequence of operations are carried out after its receipt:

Firstly, all the shift registers 24, 25 and 26 are cleared;
Secondly, a clock pulse is generated;
Thirdly, a data bit is introduced into the first position in the first shift register 24. The data bit so introduced can be shifted through the registers 24, 25 and 26 by dial pulses.

The twelve outputs of the registers 24, 25, 26 can be applied to respective solid state switches 30 which are normally in an open (no signal passed) condition, the switches when closed connecting respective television programme channels 31 to the terminal 6 (FIG. 1). By producing dial pulses so as to shift the data bit through the registers, any selected switch may be closed to make a programme selection. It will be appreciated that the entry of a data pulse into the first position of the first shift register upon resetting causes the closure of the programme selector switch connected to the first output of the register array. This resetting automatically selects a first one of the available programmes. Generally this first programme is arranged to give information relating to what programmes are available on other channels.

The solid state switches referred to as being connected to the outputs of the registers 24, 25 and 26 could be of any suitable type.

What is claimed is:

1. A logic circuit for controlling a plurality of solid state switches, comprising said solid state switches, an input to said logic circuit to which distinguishable dialling and reset pulse signals are applied, a plurality of outputs to which the respective solid state switches are connected, means for distinguishing between the dial and reset pulse signals, means for sequentially switching the outputs in response to dial pulse signals, and means for resetting the outputs to a datum condition in response to the reset and pulse signals.

2. A logic circuit according to claim 1, wherein the sequential switching means comprise means for deriving clock pulses from the dial pulse signals, and a shift register having a first position and clocked by the derived clock pulses.

3. A logic circuit according to claim 2, wherein the distinguishing means applies the reset pulse to reset and data input terminals of the shift register and to the clock pulse deriving means, whereby receipt of the reset pulse is effective firstly to clear the shift register and secondly to introduce a data pulse into the first position of the shift register.

4. A logic circuit according to claim 2, wherein the clock pulse deriving means comprises two serially connected NAND gates around which a positive feedback path is provided.

5. A logic circuit according to claim 2, wherein the dial and reset pulse signals are applied to the clock pulse deriving means via respective NAND gates.

6. A logic circuit according to claim 1, wherein the reset and dial pulse signals comprise pulses of opposite polarity, and the distinguishing means comprise a diode and a transistor connected to a common signal line, the diode being arranged to pass pulses of one polarity and the transistor being arranged to respond only to pulses of the other polarity.

* * * * *